(12) United States Patent
Chang et al.

(10) Patent No.: US 12,419,061 B2
(45) Date of Patent: Sep. 16, 2025

(54) CROSS-POINT ARCHITECTURE FOR PCRAM

(71) Applicant: Taiwan Semiconductor Manufacturing Company, Ltd., Hsinchu (TW)

(72) Inventors: Kuo-Pin Chang, Hsinchu (TW); Kuo-Ching Huang, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 547 days.

(21) Appl. No.: 17/751,638

(22) Filed: May 23, 2022

(65) Prior Publication Data

US 2023/0380194 A1  Nov. 23, 2023

(51) Int. Cl.
*H10B 63/00* (2023.01)
*G11C 5/06* (2006.01)
*H10N 70/20* (2023.01)
*H10N 70/00* (2023.01)

(52) U.S. Cl.
CPC .......... *H10B 63/845* (2023.02); *G11C 5/063* (2013.01); *H10B 63/30* (2023.02); *H10N 70/231* (2023.02); *H10N 70/021* (2023.02)

(58) Field of Classification Search
None
See application file for complete search history.

(56) References Cited

U.S. PATENT DOCUMENTS

| 2023/0230638 A1* | 7/2023 | Zhang | G11C 16/24 365/185.09 |
| 2023/0282270 A1* | 9/2023 | Bolandrina | H10B 63/30 |

* cited by examiner

*Primary Examiner* — Michelle Mandala
(74) *Attorney, Agent, or Firm* — KILPATRICK TOWNSEND & STOCKTON LLP

(57) ABSTRACT

A cell array of a memory device includes: a first deck of memory cells arranged in a first row and a second row extending in a first horizontal direction and a plurality of columns extending in a second horizontal direction, wherein the memory cells in the second row in the first deck is displaced in the first horizontal direction with respect to the memory cells in the first row in the first deck; a first common word line metal track extending in the first horizontal direction, wherein both the memory cells in the first row and the memory cells in the second row are disposed on the first common word line metal track; and a plurality of first bit line metal tracks extending in the second horizontal direction, wherein each of the plurality of first bit line metal tracks is disposed on one of the first deck of memory cells.

20 Claims, 11 Drawing Sheets

| MC # | A | B | C | D | E | F | ... | K | L | M | N | O | P |
|---|---|---|---|---|---|---|---|---|---|---|---|---|---|
| WL Programmed or Inhibited? (When WL0-0=1 and WL1-0=0) | PGM | INH | PGM | INH | PGM | INH | ... | PGM | INH | PGM | INH | PGM | INH |
| BL Programmed or Inhibited? (When BL1=1 and other BLs=0) | PGM | PGM | INH | INH | INH | INH | ... | INH | INH | INH | INH | INH | INH |
| Read/Write Enabled? | YES | NO | NO | NO | NO | NO | ... | NO | NO | NO | NO | NO | NO |

PGM = programmed
INH = inhibited

FIG. 5

CROSS-POINT ARCHITECTURE FOR PCRAM

FIELD

Embodiments of the present disclosure relate generally to memory devices, and more particularly to phase-change random-access memory (PCRAM) devices.

BACKGROUND

Data is the most valuable resource in today's digital economy, and more data than ever needs to be processed. Memory plays a key role in the flow of data. The gap between logic and memory is a bottle neck to system performance. To optimize the trade-off between cost and performance, various types of memory devices are used in combination to accommodate different use cases. For instance, static random-access memory (SRAM) devices are integrated right on the logic chips as cache memory to provide fast access; dynamic random-access memory (DRAM) devices provide an off-chip memory solution and support higher memory capacity; flash memory devices provide much higher memory capacity and density while preserving information in the absence of power.

In recent years, unconventional nonvolatile memory (NVM) devices, such as ferroelectric random-access memory (FRAM) devices, phase-change random-access memory (PCRAM) devices, magnetoresistive random-access memory (MRAM), and resistive random-access memory (RRAM) devices, have emerged. These unconventional NVM devices (sometimes referred to as "emerging memory devices") use new types of materials and mechanisms to store data. They are promising for blending the memory hierarchy mentioned above to boost the overall performance. Furthermore, their unique characteristics offer great potential to enable new applications (e.g., artificial intelligence, high performance computing, etc.) and novel architectures.

Therefore, there is a need to improve the performance of emerging memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is a diagram illustrating the operation of the equivalent circuit 400 shown in FIG. 4 in accordance with some embodiments.

DETAILED DESCRIPTION OF THE INVENTION

Figure 1A:
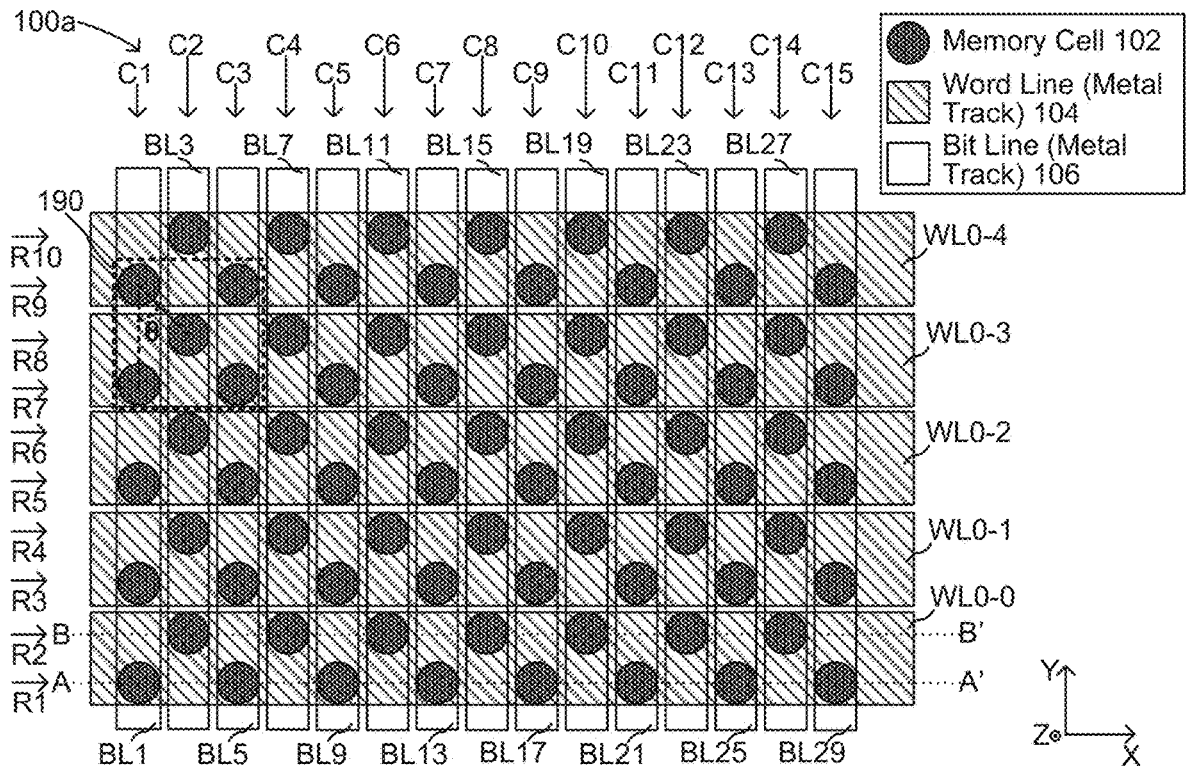
FIG. 1A is a diagram illustrating an example memory cell array in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

Phase-change random-access memory (PCRAM) devices are a type of non-volatile memory (NVM) devices that are promising candidates for the next generation of non-volatile electronic memory as PCRAM devices provide faster speeds and lower power consumption while maintaining low manufacturing costs compared to other commonly used NVM devices.

PCRAM devices generally include, for each memory cell ("MC"), a phase-change material (PCM) layer arranged between the top and bottom electrodes coupled to control circuitry. PCRAM devices are configured to operate based upon a process of reversible switching between resistive states. The reversible switching is enabled by changing the phase of the PCM layer, which includes a structure that may change phase between amorphous and crystalline based on, for example, temperature change sequences via joule heating. Joule heating involves the heat that is produced during the flow of an electric current through a conductive material. As the PCM layer changes phase from crystalline to amorphous, for example, due to heating and cooling sequences controlled by, for example, applied voltage biases from the control circuitry, the resistance of the PCM layer changes from low to high, respectively. Accordingly, PCRAM devices can store data by switching between the high resistance state (HRS) and the low resistance state (LRS), corresponding to a first data state (e.g., a "logic 0") and a second data state (e.g., a "logic 1"), respectively, or vice versa.

There are, however, some challenges related to PCRAM devices. One challenge is the chip area efficiency. The driver area (e.g., the area for the word line driver circuit) is a key parameter for small-unit memory designs such as embedded memory devices or tiles of storage class memory (SCM) devices. For example, a large chip area of an SCM device is divided into small regions called "tiles," and each tile has its own word line driver circuit and bit line sensing circuit at its periphery. The transistor size inside the word line driver circuit is typically large in order to enable higher current for write operations (i.e., write current). Thus, the area of the word line driver circuit directly impacts the overall chip area, chip cost, and chip area efficiency. It is desirable to have a smaller area of the word line driver circuit for a given memory capacity.

Another challenge is word line resistance. Word line resistance increases as the word line pitch scales down. A higher resistance results in insufficient write current for switching PCM. A higher resistance also leads to a higher latency, which degrades the overall chip performance. Therefore, it is desirable to have a smaller word line resistance for a given memory capacity.

In accordance with some aspects of the disclosure, a novel cross-point architecture of a cell array of a memory device is provided. In the novel cross-point architecture, each memory cell is still located at a topological cross-point between a bit line and a word line. However, the memory cells form a lattice (e.g., a centered squared lattice) different from a square lattice in a conventional cross-point architecture. For each memory cell in the lattice, the closest memory cell is located neither in the same row nor in the same column. Instead, each of the closest memory cells is located in a neighboring row and in a neighboring column.

As a result, the memory cells in a second row next to a first row are shifted or displaced in the extending direction of the rows with respect to the memory cells in the first row. The displacement enables connecting each of the memory cells in two neighboring rows separately using separate bit lines.

Because the common word lines are used, the number of word line driver sets is reduced. Fewer word line driver sets can reduce the area of the word line driver circuit, thus reducing the overall chip area and chip cost. In addition, the metal tracks of the common word lines are wider. Therefore, the word line resistance is reduced due to the larger cross-section area. The smaller word line resistance can enable sufficient current for write operations and lower latency, therefore enhancing the overall chip performance.

Moreover, the word line metal tracks in conventional cross-point architecture typically need costly immersion layers during the self-aligned double patterning (SADP) process. In contrast, the wider common word line metal tracks do not need the SADP process and the costly immersion layers, thus releasing fabrication complexity and difficulty.

Lastly, design rules restrict the minimum distance between two memory cells. Due to the displacement, the distance between the two closest memory cells in the extending direction of the rows becomes smaller. As a result, the bit lines can have a tighter arrangement.

In one implementation, each memory cell includes a phase-change material (PCM) layer and a selector. It should be understood that the techniques disclosed in the present disclosure are also applicable to other types of resistive-type memory devices, such as magnetoresistive random-access memory (MRAM) devices and resistive random-access memory (RRAM) devices.

Example Cell Array Architectures

Figure 1B:
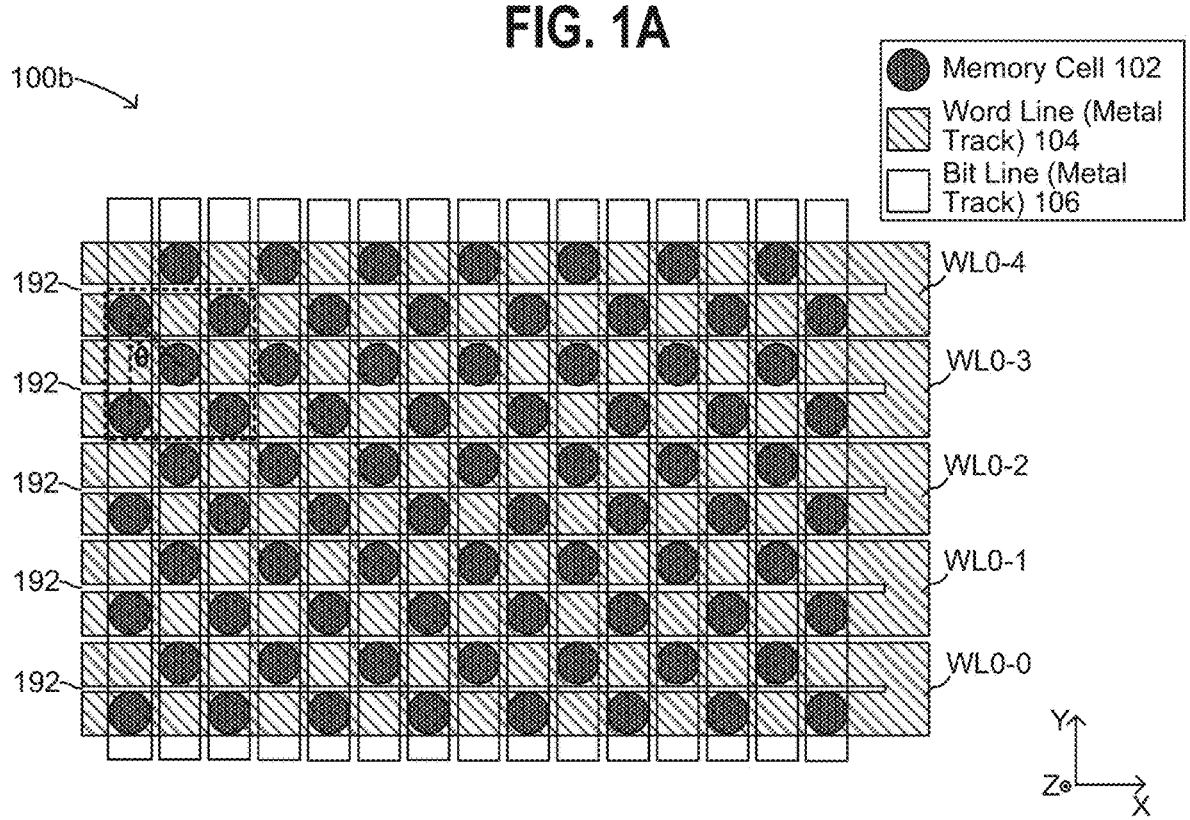
FIG. 1B is a diagram illustrating another example memory cell array in accordance with some embodiments.

FIG. 1A is a diagram illustrating an example memory cell array 100a in accordance with some embodiments. FIG. 1B is a diagram illustrating another example memory cell array 100b in accordance with some embodiments. It should be understood that FIGS. 1A and 1B are not drawn to scale.

In the example shown in FIG. 1A, multiple memory cells ("MC") 102 are arranged in a horizontal plane (i.e., the X-Y plane shown in FIG. 1A). The memory cells 102 are arranged in multiple (ten in this example shown in FIG. 1A) rows labeled as R1 to R10 and multiple (fifteen in this example shown in FIG. 1A) columns labeled as C1 to C15.

In a conventional cross-point architecture, memory cells form an upright square lattice in the horizontal plane, and a memory cell is located at a topological cross-point between a bit line and a word line. For each memory cell in the upright square lattice, the closest memory cells are located in either the same row or the same column.

In contrast, in the example shown in FIG. 1A, a novel cross-point architecture is used. Each memory cell 102 is still located at a topological cross-point between a bit line 106 and a word line 104. However, the memory cells 102 form a different lattice (e.g., a centered squared lattice in one example). For each memory cell 102 in the lattice, the closest memory cells 102 is located neither in the same row nor in the same column. Instead, each of the closest memory cells 102 is located in a neighboring row and in a neighboring column.

The region 190 shown in FIG. 1A is an exemplary "unit," which includes five memory cells 102 across three rows R7, R8, and R9 and three columns C1, C2, and C3. For the memory cell in row R8 and column C2, the remaining four memory cells 102 in the region 190 are its closest memory cells 102. Each of these four memory cells 102 is in a neighboring row (i.e., row R7 or row R9) and in a neighboring column (i.e., column C1 or column C3). The closest memory cell 102 in the same row is located in row R8 and column C4 and has a longer distance than these four memory cells 102 in the region 190. Likewise, the closest memory cell 102 in the same column is located in row R10 (or row R6) and column C2 and has a longer distance than these four memory cells 102 in the region 190.

A line segment between the center of the memory cell 102 in row R8 and column C2 and the center of one of its closet memory cell 102 (e.g., the memory cell 102 in row R9 and column C1) is shown in FIG. 1. This line segment and the Y-direction (i.e., the extending direction of the columns, also referred to as "the first horizontal direction") define an angle θ. In one embodiment, the angle θ is between 15 degrees and 60 degrees. In one example, the angle θ is 15 degrees. In another example, the angle the angle θ is 30 degrees. In yet another example, the angle θ is 45 degrees. In still another example, the angle θ is 60 degrees.

Due to the novel cross-point architecture, the memory cells 102 in the next row are shifted or displaced in the X-direction (i.e., the extending direction of the rows, also referred to as "the first horizontal direction"). As a result, none of any two of the memory cells 102 in the neighboring rows overlap in the X-direction. The displacement enables connecting each of the memory cells 102 in two neighboring rows separately using separate bit lines 106. For instance, each of the memory cells 102 in row R1 and row R2 can be (electrically) connected to a separate bit line 106 due to the displacement in the X-direction. Specifically, the memory cell 102 in row R1 and column C1 is connected to the bit line BL1; the memory cell 102 in row R2 and column C2 is connected to the bit line BL3; the memory cell 102 in row R1 and column C3 is connected to bit line BL5. Because each of the memory cells 102 in two neighboring rows can be separately connected to a separate bit line 106, all the memory cells 102 in these two neighboring rows can be connected to a common word line 104. In the example above, all the memory cells 102 in row R1 and row R2 can be connected to the common word line WL0-0 (the first digit "0" means the "deck" number in the vertical direction, i.e., the Z-direction shown in FIG. 1A, and details of "deck" will be described below). Similarly, all the memory cell 102 in row R3 and row R4 can be connected to the common word line WL0-1; all the memory cell 102 in row R5 and row R6 can be connected to the common word line WL0-2; all the memory cell 102 in row R7 and row R8 can be connected to the common word line WL0-3; all the memory cell 102 in row R9 and row R10 can be connected to the common word line WL0-4. Each of the common word lines WL0-0, WL0-1, WL0-2, WL0-3, WL0-4 is connected to a separate word line driver set.

Because the common word lines WL0-0, WL0-1, WL0-2, WL0-3, WL0-4 are used, the number of word line driver sets is reduced by 50%. In the example shown in FIG. 1A, only five word line driver sets are needed for ten rows, whereas ten word line driver sets are needed in the conventional cross-point architecture. Fewer word line driver sets can reduce the area of the word line driver circuit, thus reducing the overall chip area and chip cost.

In addition, the metal tracks of the common word lines WL0-0, WL0-1, WL0-2, WL0-3, WL0-4 are wider in the Y-direction, the word line resistance is reduced due to the larger cross-section area. The smaller word line resistance can enable sufficient current for write operations and lower latency, therefore enhancing the overall chip performance.

Moreover, the word line metal tracks in conventional cross-point architecture typically need costly immersion layers during the self-aligned double patterning (SADP) process. In contrast, the wider common word line metal tracks do not need the SADP process and the costly immersion layers, thus releasing fabrication complexity and difficulty.

Lastly, design rules restrict the minimum distance D between two memory cells 102 (e.g., the memory cell in row R8 and column C2 and the memory cell in row R9 and column C1). Due to the angle θ, the distance between those two closest memory cells 102 in the X-direction becomes D·sin θ, a smaller distance than D. As a result, a smaller bit line pitch can be achieved for higher throughput of the cell array 110a. In other words, the bit lines 106 can have a tighter arrangement.

It should be understood that the cell array 100a is exemplary rather than limiting. One of ordinary skill in the art would recognize many variations, modifications, and alternatives within the contemplation of the present disclosure. Although the memory cells shown in FIG. 1A are circular, other cross-sectional shapes can be employed as well. Moreover, although only one "deck" (corresponding to one horizontal plane, i.e., one X-Y plane) is shown in FIG. 1, multiple decks can be employed in other embodiments (e.g., 3D memory devices). As will be described below, the common word lines WL0-0, WL0-1, WL0-2, WL0-3, WL0-4 can be further shared across decks.

The cell array 100b shown in FIG. 1B is similar to the cell array 100a shown in FIG. 1A, except that each of the common word lines is formed by connecting two neighboring narrow word line metal tracks (each corresponding to one row) at one end in the X-direction. In other words, each of the common word line metal tracks has a U-shape cross-section in the X-Y plane, and there is a split between these two original word line metal tracks.

In another embodiment, each of the common word lines can be formed by connecting two neighboring narrow word line metal tracks (each corresponding to one row) at both ends in the X-direction. In other words, each of the common word line metal tracks has a slit in the middle, which is surrounded by the common word line metal track. The slit extends in the X-direction.

Likewise, because the common word lines WL0-0, WL0-1, WL0-2, WL0-3, WL0-4 are used, the number of word line driver sets is reduced by 50%. In the example shown in FIG. 1A, only five word line driver sets are needed for ten rows, whereas ten word line driver sets are needed in the conventional cross-point architecture. Fewer word line drivers can reduce the area of the word line driver circuit, thus reducing the overall chip area and chip cost.

Again, it should be understood that the embodiments shown in FIGS. 1A and 1B are exemplary, and one of ordinary skill in the art would recognize many variations, modifications, and alternatives within the contemplation of the present disclosure.

Example Memory Devices Including the Example Cell Array Architectures

Figure 2A:
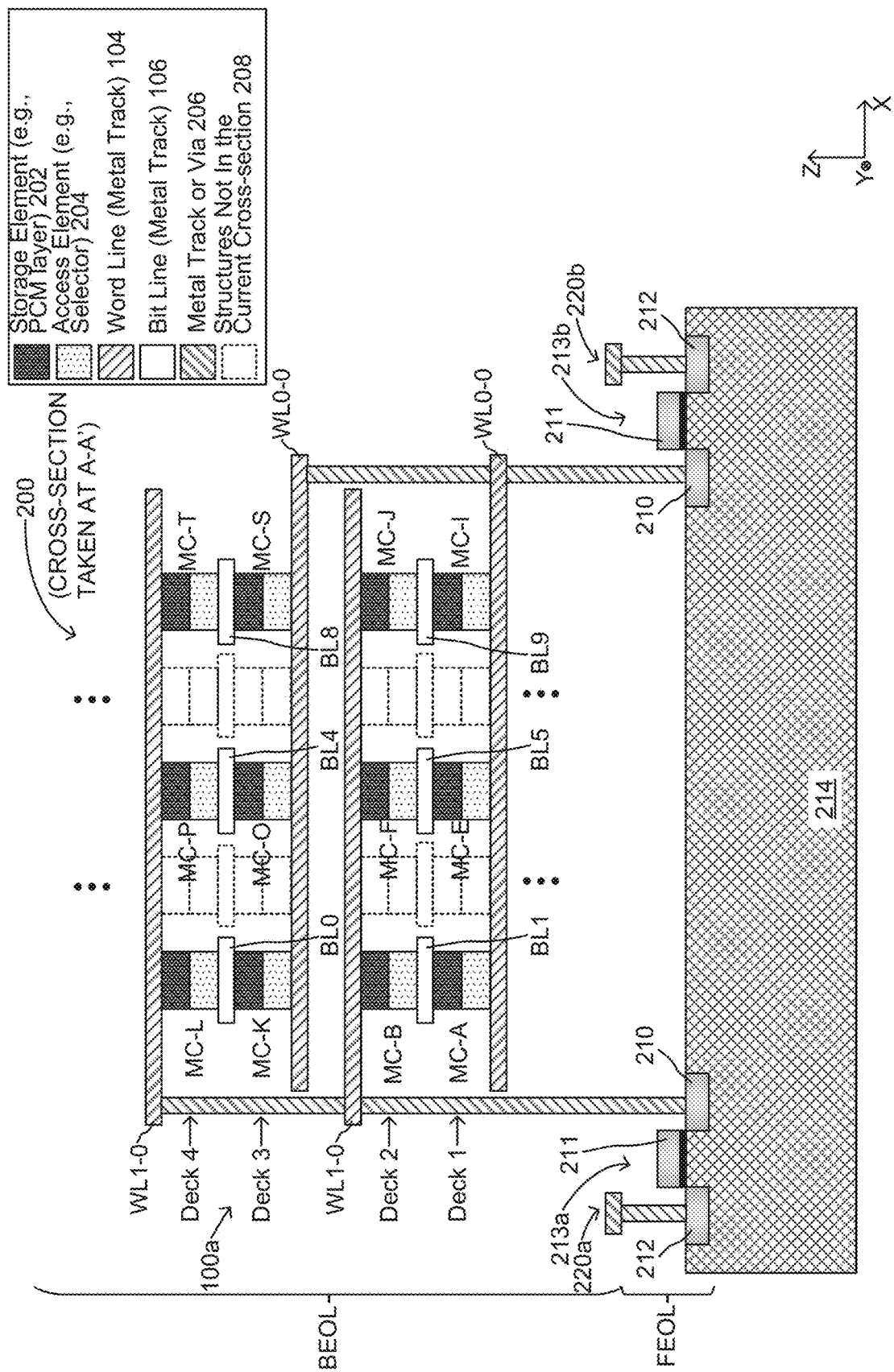
FIG. 2A is a diagram illustrating a first cross-section, taken at A-A', of an example memory device including the cell array 100a shown in FIG. 1A in accordance with some embodiments.
Figure 2B:
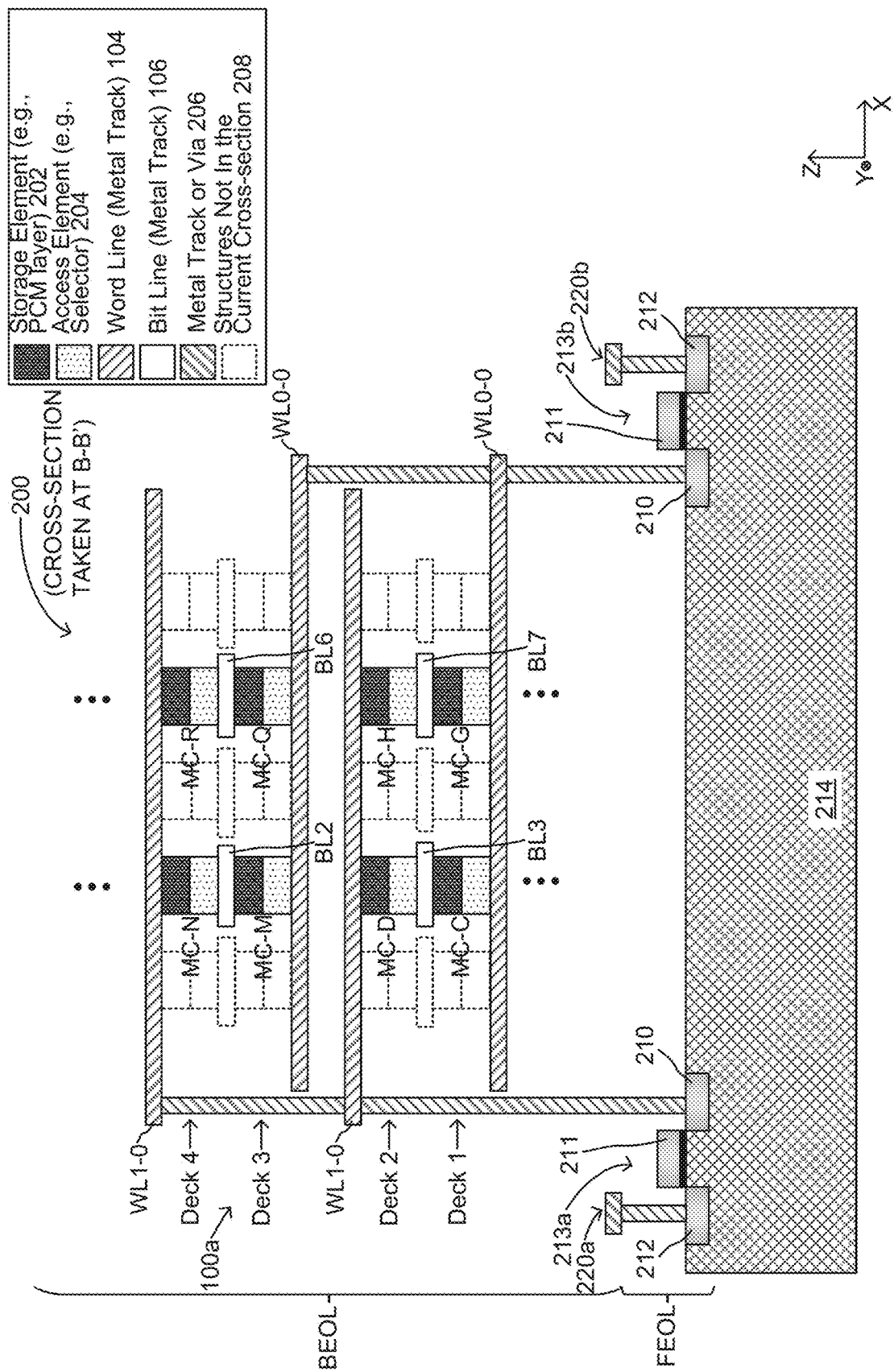
FIG. 2B is a diagram illustrating a second cross-section, taken at B-B', of an example memory device including the cell array 100a shown in FIG. 1A in accordance with some embodiments.

FIG. 2A is a diagram illustrating a first cross-section, taken at A-A', of an example memory device 200 including the cell array 100a shown in FIG. 1A in accordance with some embodiments. FIG. 2B is a diagram illustrating a second cross-section, taken at B-B', of an example memory device 200 including the cell array 100a shown in FIG. 1A in accordance with some embodiments. It should be understood that FIGS. 2A and 2B are not drawn to scale.

The memory device 200 includes, among other components, a substrate 214, select transistors 213a and 213b, and the cell array 100a shown in FIG. 1A. The select transistors 213a and 213b are fabricated on the substrate 214 using front end of line (FEOL) processes, whereas the cell array 100a is fabricated in one or more interlayer dielectric (ILD) layers using back end of line (BEOL) processes.

The substrate 214 may be, for example, a bulk substrate (e.g., a bulk silicon substrate) or a silicon-on-insulator (SOI) substrate. In some examples, the substrate 214 may also be a binary semiconductor substrate (e.g., GaAs), a ternary semiconductor substrate (e.g., AlGaAs), or a higher-order semiconductor substrate. The substrate 214 may, in some embodiments, include shallow trench isolation (STI) regions formed by filling trenches in the substrate 114 with dielectric.

In the illustrated example, each of the select transistors 213a and 213b includes a source region 212 and a drain region 210 formed in the substrate 214, and a gate 211 formed on the top surface of the substrate 214. It should be noted that the select transistors 213a and 213b are only exemplary and other types of transistors (e.g., FinFETs, GAA FETs) are within the scope of the disclosure.

The source region 212 of the select transistor 213a is connected to a node 220a through conductive (e.g., metal) track(s) and via(s), whereas the drain region 210 of the select transistor 213a is connected to word lines WL1-0 through a metal via 206. The node 220a is operable to receive a select voltage, which can be applied to the word lines WL1-0, when the select transistor 213a is turned on. Likewise, the source region 212 of the select transistor 213b is connected to a node 220b through conductive (e.g., metal) track(s) and via(s), whereas the drain region 210 of the select transistor 213b is connected to word lines WL0-0 through a metal via 206. The node 220b is operable to receive another select voltage, which can be applied to the word line WL0-0, when the select transistor 213b is turned on.

The select transistors 213a and 213b are operable to control the current flow through the memory cells 102 in the cell array 100a during operations. The select transistors 213a and 213b may provide functions that are needed to operate the memory cells 102 in the cell array 100a. For example, the select transistors 213a and 213b may be operable to control the programming operation, the erase operating, and the read operation of the memory cells 102.

In the example shown in FIG. 1A, the cell array 100a includes four decks (i.e., layers) of memory cells 102 one over another in the Z-direction. Deck 1 and Deck 3 are both connected to the word line WL0-0, while Deck 2 and Deck 4 are both connected to the word line Wl1-0. In other words, Deck 1 and Deck 3 share a common word line 104, while Deck 2 and Deck 4 share a common word line 104.

Memory cells 102 in the same column in Deck 1 and Deck 2 share a common bit line 106. Specifically, memory cells MC-A and MC-B share a common bit line BL1; memory cells MC-E and MC-F share a common bit line BL5; memory cells MC-I and MC-J share a common bit line BL9. Since memory cells 102 in Deck 1 and memory cells 102 in Deck 2 are connected to the word line WL0-0 and the word line WL1-0, respectively, each memory cell 102 can be separately selected by picking a combination of one word line 104 and one bit line 106.

Likewise, memory cells 102 in the same column in Deck 3 and Deck 4 share a common bit line 106. Specifically, memory cells MC-K and MC-L share a common bit line BL0; memory cells MC-O and MC-P share a common bit line BL4; memory cells MC-S and MC-T share a common bit line BL8. Since memory cells 102 in Deck 3 and memory cells 102 in Deck 4 are connected to the word line WL0-0 and the word line WL1-0, respectively, each memory cell 102 can be separately selected by picking a combination of one word line 104 and one bit line 106.

Each memory cell 102 includes, among other components, a storage element 202 and an access element 204. The storage element 202 is operable to store data (i.e., "0" or "1") based on the high-resistance state (HRS) and the low-resistance state (LRS) thereof. The access element 204 is operable to provide access to the storage element 202 based on the voltages applied to the corresponding word line 104 and the corresponding bit line 106. In one embodiment, the storage element 202 is a phase-change material (PCM) layer, while the access element 204 is a selector. High-density memory architectures (e.g., cross-point architectures) are typically realized by using this "1S1R" structure (one selector paired with one memory) as a building block. For clarity, this embodiment will be used throughout the description below, but it should be understood that other storage elements 202 and other access elements 204 are within the contemplation of the present disclosure. Examples of the storage element 202 may include the storage elements of resistive-type memory devices such as magnetoresistive random-access memory (MRAM) devices and resistive random-access memory (RRAM) devices. In one example, the MRAM device is a spin-torque-transfer (STT) MRAM device. In another example, the MRAM device is a spin-orbit-torque (SOT) MRAM device.

The PCM layer 202 is formed on or disposed on the selector 204 in the same memory cell 102. It should be understood that the selector 204 may be formed on the PCM layer 202 in the same memory cell 102 in other embodiments. As explained above, the resistive states of the PCM layer 202 can go through reversible switching between amorphous and crystalline. As the PCM layer 202 changes phase from crystalline to amorphous, for example, due to heating and cooling sequences, the resistive state of the PCM layer 202 switches from the low-resistance state (LRS) to the high-resistance state (HRS).

In some examples, the PCM layer 202 includes one or more layers of a binary system of Ga—Sb, In—Sb, In—Se, Sb—Te, Ge—Te, and Ge—Sb; a ternary system of Ge—Sb—Te, In—Sb—Te, Ga—Se—Te, Sn—Sb—Te, In—Sb—Ge, and Ga—Sb—Te; a quaternary system of Ag—In—Sb—Te, Ge—Sn—Sb—Te, Ge—Sb—Se—Te, Te—Ge—Sb—S, Ge—Sb—Te—O, and Ge—Sb—Te—N; a chalcogenide alloy containing one or more elements from Group VI of the periodic table, a Ge—Sb—Te alloy, $Ge_2Sb_2Te_5$, tungsten oxide, nickel oxide, copper oxide, or combinations thereof. It should be understood that these materials are exemplary rather than limiting. In some implementations, the PCM layer 202 is formed by chemical vapor deposition (CVD), physical vapor deposition (PVD), pulsed laser deposition (PLD), sputtering, atomic layer deposition (ALD), or any other thin film deposition processes.

The phase transition between the crystalline phase and the amorphous phase of the PCM layer 202 is related to the interplay between the long-range order and the short-range order of the structure of the material of the PCM layer 202. For example, the collapse of the long-range order generates the amorphous phase. The long-range order in the crystalline phase facilitates electrical conduction, while the amorphous phase impedes electrical conduction and results in high electrical resistance. To tune the properties of the PCM layer 202 for different needs, the material of the PCM layer 202 may be doped with various elements at different amounts to adjust the proportion of the short-range order and the long-range order inside the bonding structure of the material. The doped element may be any element used for semiconductor doping through the use of, for example, ion implantation or diffusion.

Again, although PCM layer 202 is used as an example, the techniques described in the present disclosure are generally applicable to other resistive-type memory devices such as MRAM devices and RRAM devices. The selector 204 is a two-terminal device that turns on when the voltage applied on it is above a threshold voltage and stays off otherwise. When the cell array 100a is properly biased to operate a selected memory cell 102, the leakage current from non-selected memory cells 102 can be eliminated by the selectors 204 connected in series to each of those non-selected memory cell 102 because the voltage is mainly applied on the selectors 204 when they stay off. For the selected memory cell 102, the selector 204 of the selected memory cell 102 turns on, and the voltage is mainly applied on the PCM layer 202.

The selector 204 matches the characteristics of the corresponding PCM layer 202 to achieve high performance. Some requirements for the selector include on-state to off-state current ratio (non-linearity), high on-state current density, fast switching speed, high endurance cycles, high thermal stability, ease of process integration, and operational compatibility with the PCM layer 202 (or generally the storage component 202). In one implementation, the selector 204 is an ovonic threshold switch (OTS). In order to work more efficiently with the logic portion of the memory device 200, the total operating voltage of the selector 204 and the PCM layer 202 is compatible with the supply voltage of the logic portion in one embodiment. In one example, the total operation voltage is 1.5 V.

In some examples, the selector 204 includes GeTe, AsGeSe, GeSbTe, GeSiAsTe, GeSe, GeSbSe, GeSiAsSe, GeS, GeSbS, GeSiAsS, or combinations thereof. In other examples, the selector 204 includes BTe, CTe, BCTe, CSiTe, BSiTe, BCSiTe, BTeN, CTeN, BCTeN, CSiTeN, BSiTeN, BCSiTeN, BTeO, CTeO, BCTeO, CSiTeO, BSiTeO, BCSiTeO, BTeON, CTeON, BCTeON, CSiTeON, BSiTeON, BCSiTeON, or combinations thereof. It should be understood that these materials are exemplary rather than limiting. In some implementations, the selector 204 is formed by CVD, PVD, PLD, sputtering, ALD, or any other thin film deposition processes.

Similarly, at the cross-section taken at B-B' shown in FIG. 2B, memory cells 102 in the same column in Deck 1 and Deck 2 share a common bit line 106. Specifically, memory cells MC-C and MC-D share a common bit line BL3; memory cells MC-G and MC-H share a common bit line BL7. Since memory cells 102 in Deck 1 and memory cells 102 in Deck 2 are connected to the word line WL0-0 and the word line WL1-0, respectively, each memory cell 102 can be separately selected by picking a combination of one word line 104 and one bit line 106.

Likewise, memory cells 102 in the same column in Deck 3 and Deck 4 share a common bit line 106. Specifically, memory cells MC-M and MC-N share a common bit line BL2; memory cells MC-Q and MC-R share a common bit line BL6. Since memory cells 102 in Deck 3 and memory cells 102 in Deck 4 are connected to the word line WL0-0 and the word line WL1-0, respectively, each memory cell 102 can be separately selected by picking a combination of one word line 104 and one bit line 106.

The memory cells 102 in neighboring rows (row R1 and row R2 in this example) in the same deck are shifted or displaced in the X-direction such that any two of them are not located in the same column. Thus, each of the memory cells 102 is connected to a separate bit line 106.

In the meantime, the common word line WL0-0 is shared between the Deck 1 and the Deck 3, and the common word line WL1-0 is shared between the Deck 2 and the Deck 4. Since they are separated vertically in the Z-direction, the memory cells 102 (e.g., the memory cells MC-C and MC-M) that share the common word line 104 (e.g., the word line WL0-0) across different decks (e.g., the Deck 1 and the Deck 3) can be connected to separate bit lines 106 (e.g., the bit line BL3 and the bit line BL2). The common word line scheme across decks in the vertical direction increases the chip area efficiency. As a result of both the common word line scheme applied on two neighboring rows in the same deck and the shared common word line scheme across decks in the vertical direction, the number of word line driver sets can be reduced by 50% for a given memory capacity in the embodiment of four decks shown in FIGS. 2A and 2B.

It should be understood that five columns are shown in FIGS. 2A and 2B for the clarity of illustration, and other column numbers (e.g., fifty, one hundred, five hundred, one thousand, two thousand, etc.) can be employed in other embodiments. It should be understood that four decks are shown in FIGS. 2A and 2B only as an example, and other deck numbers (any even number that is larger than four) can be employed in other embodiments. It should be understood that two rows are shown in FIGS. 2A and 2B for the clarity of illustration, and other row numbers (e.g., fifty, one hundred, five hundred, one thousand, two thousand, etc.) can be employed in other embodiments. In summary, the cell array 100a shown in FIGS. 2A and 2B can repeat themselves or be duplicated in one or more of the X-direction, the Y-direction, and the Z-direction as needed in various embodiments.

Figure 3:
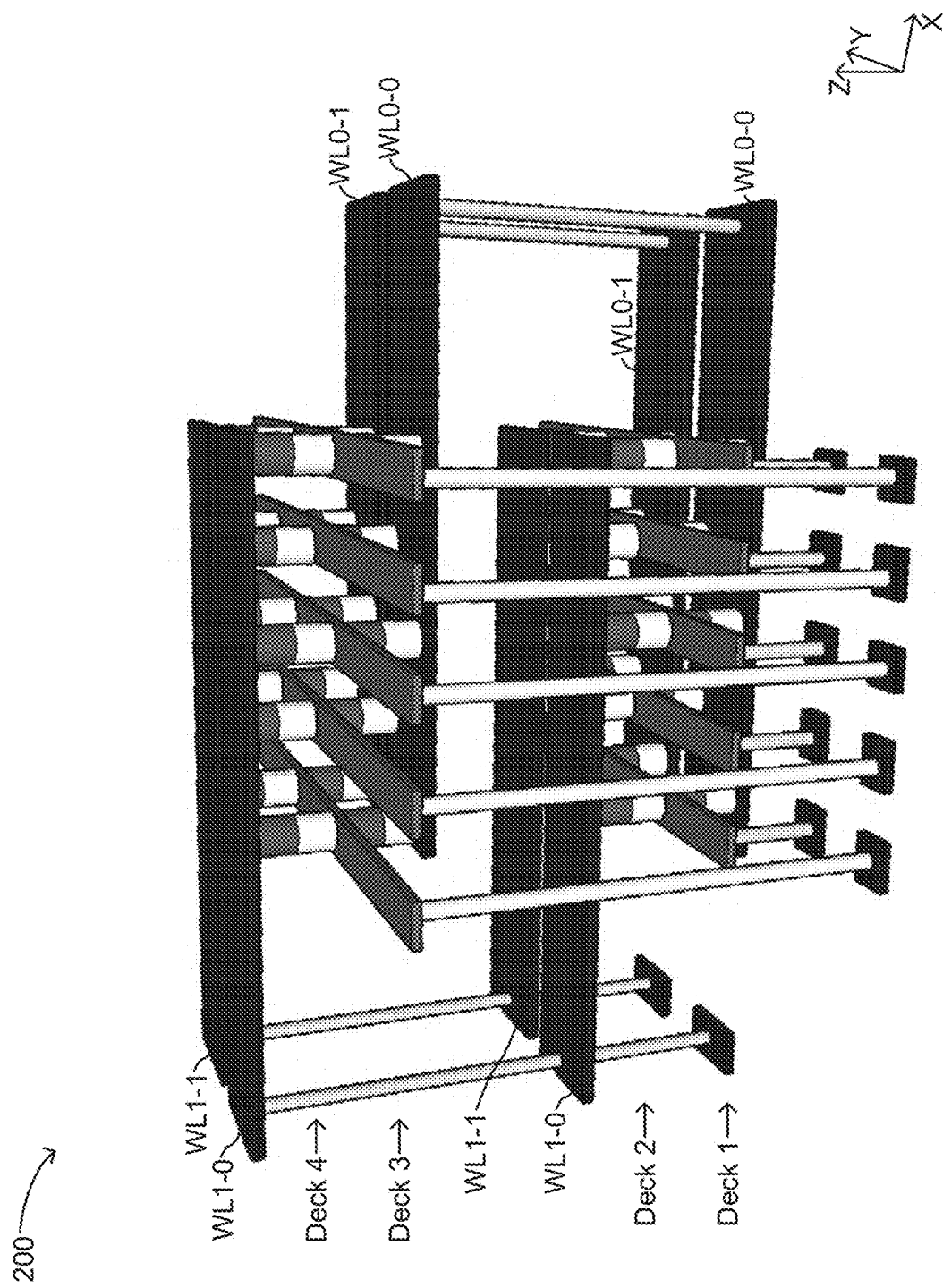
FIG. 3 is a diagram illustrating a perspective view of a portion of the memory device 200 shown in FIGS. 2A and 2B in accordance with some embodiments.

FIG. 3 is a diagram illustrating a perspective view of a portion of the memory device 200 shown in FIGS. 2A and 2B in accordance with some embodiments. It should be noted that the two additional rows (i.e., the row R3 and the row R4) are shown in FIG. 3 as compared to FIGS. 2A and 2B. For each deck, the memory cells 102 in the row R3 and the row R4 are connected by a common word line WL0-1 or WL1-1 (the second digit becomes "1" instead of "0"). Similarly, the common word line WL0-1 is shared between the Deck 1 and the Deck 3, whereas the common word line WL1-1 is shared between the Deck 2 and the Deck 4. Again, it should be understood that other row numbers (e.g., fifty, one hundred, five hundred, one thousand, two thousand, etc.) can be employed in other embodiments.

Equivalent Circuit and Operation Thereof

Figure 4:
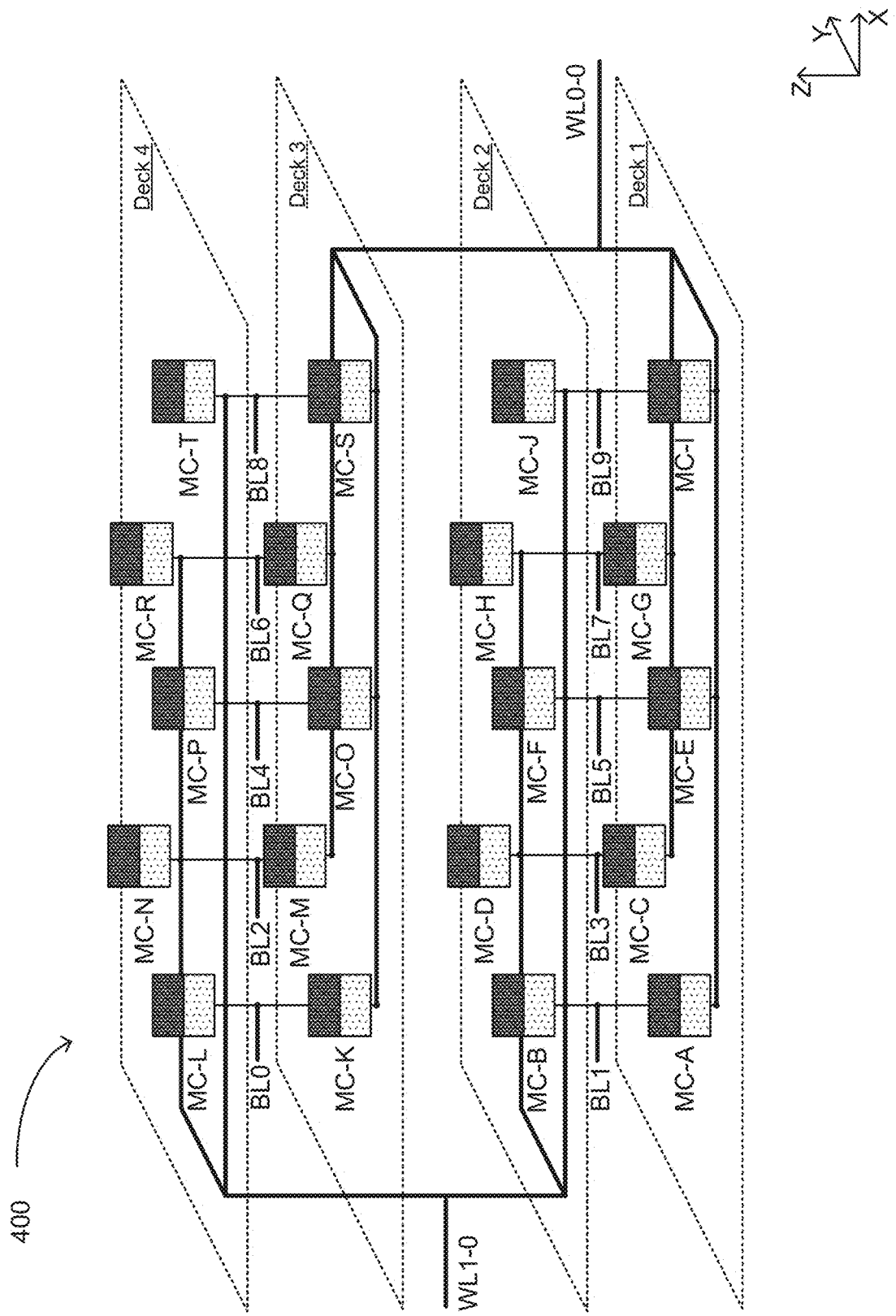
FIG. 4 is a schematic diagram illustrating an example equivalent circuit of the cell array 100a shown in FIGS. 2A and 2B in accordance with some embodiments.

FIG. 4 is a schematic diagram illustrating an example equivalent circuit 400 of the cell array 100a shown in FIGS. 2A and 2B in accordance with some embodiments. FIG. 5 is a diagram illustrating the operation of the equivalent circuit 400 shown in FIG. 4 in accordance with some embodiments.

As shown in FIG. 5, when the word line WL0-0 is activated (i.e., WL0-0=1, and WL1-0=0), the memory cells 102 on the Deck 1 and the Deck 3 are accessed (i.e., "programmed" as shown in FIG. 5), while the memory cells 102 on the Deck 2 and the Deck 4 are not accessed (i.e., "inhibited" as shown in FIG. 5). Accordingly, the following memory cells 102 are accessed: MC-A, MC-C, MC-E, MC-G, MC-I, MC-K, MC-M, MC-O, MC-Q, and MC-S. The selectors 204 in these memory cells 102 are turned on.

Each of these accessed memory cells 102 is connected to a separate bit line 106. Because the memory cell 102 that shares its bit line 106 is located in a neighboring deck (e.g., the Deck 2 or the Deck 4) and not accessed (because the word line WL1-0 is not activated). As a result, only one memory cell 102 in these accessed memory cells 102 is selected depending on which bit line 106 is activated.

In the example shown in FIG. 5, when the bit line BL1 is activated (i.e., BL1=1, and other BLs=0), the memory cell MC-A is selected. Although the memory cell MC-B is also connected to the bit line BL1, it is not selected because its corresponding word line WL1-0 is not activated. The same analysis applies to all combinations of word line activation and bit line activation.

Example Process Flow for Fabricating the Cell Array

Figure 6:
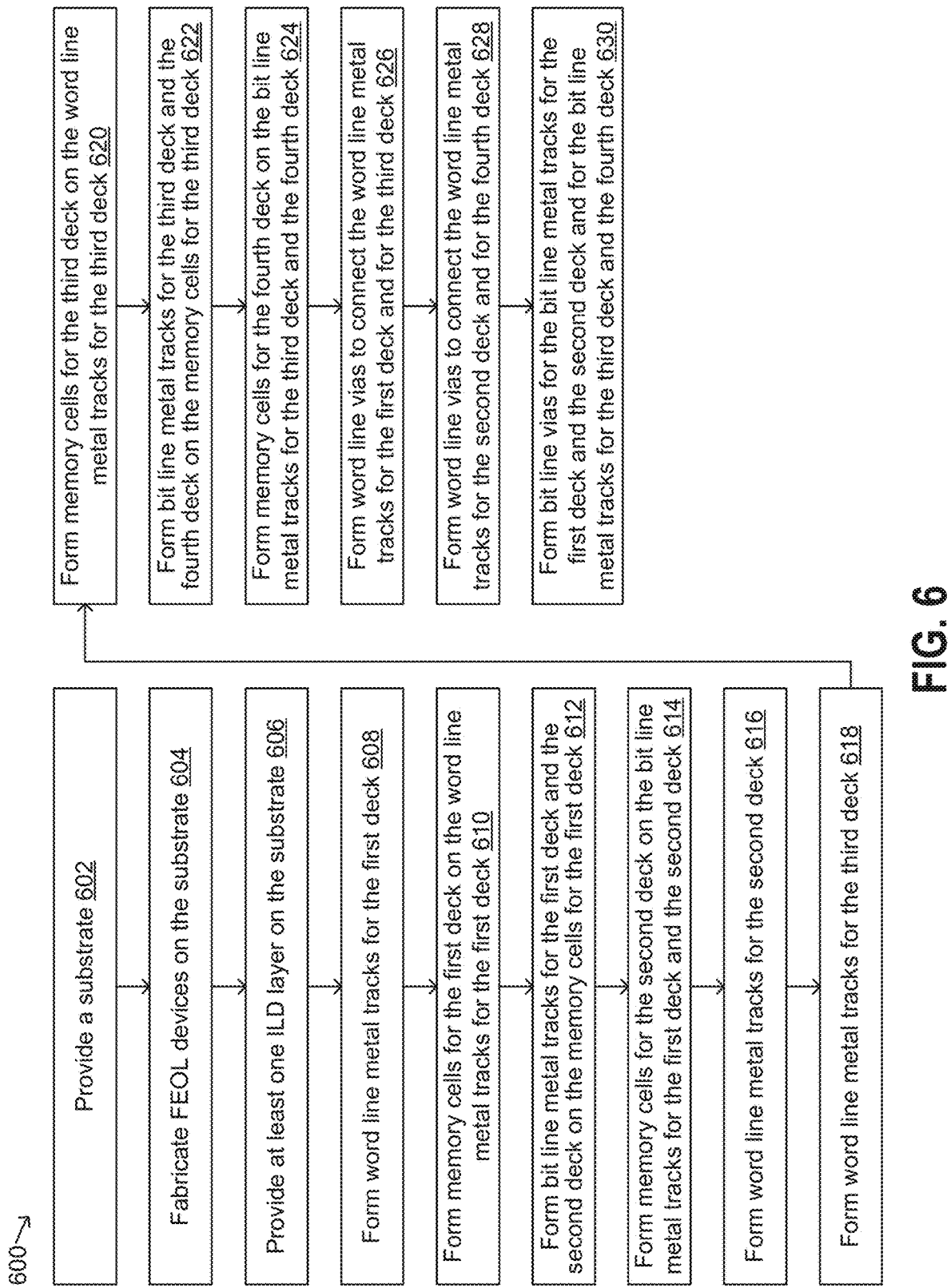
FIG. 6 is a flowchart diagram illustrating an example method for fabricating a memory device in accordance with some embodiments.

FIG. 6 is a flowchart diagram illustrating an example method 600 for fabricating a memory device in accordance with some embodiments. In the example shown in FIG. 6, the method 600 includes operations 602, 604, 606, 608, 610, 612, 614, 416, 618, 620, 622, 624, 626, 628, and 430. Additional operations may be performed. Also, it should be understood that the sequence of the various operations discussed above with reference to FIG. 6 is provided for illustrative purposes, and as such, other embodiments may utilize different sequences. These various sequences of operations are to be included within the scope of embodiments. FIGS. 7A-7G are cross-sectional views of a portion of the memory device at various stages of fabrication in accordance with some embodiments.

The method 600 starts at operation 602. At operation 602, a substrate is provided. In one implementation, the substrate is made of silicon. It should be understood that this implementation is not intended to be limiting.

At operation 604, devices are fabricated on the substrate using FEOL processes. In one example, select transistors (e.g., the select transistors 213a and 213b shown in FIG. 2A) are fabricated on the substrate. It should be understood that other types of devices can be fabricated on the substrate as needed.

At operation 606, at least one ILD layer is fabricated on the substrate using BEOL processes. In one implementation, the at least one ILD layer is made of an oxide such as Phospho-Silicate Glass (PSG), Boro-Silicate Glass (BSG), Boron-Doped Phospho-Silicate Glass (BPSG), tetraethyl orthosilicate (TEOS), or the like.

Figure 7A:
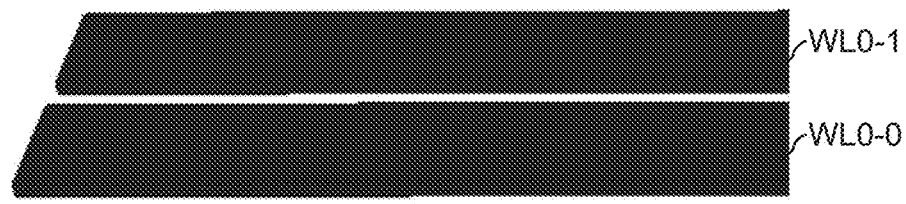
FIGS. 7A-7G are cross-sectional views of a portion of the memory device at various stages of fabrication in accordance with some embodiments.

At operation 608, word line metal tracks for the first deck is formed. As shown in FIG. 7A, the word line metal tracks corresponding to the word lines WL0-0 and WL0-1 are formed. In one implementation, the word line metal tracks for the first deck are formed by forming trenches in the at least one ILD layer and the filling metal layer in the trenches, followed by a planarization process such as a chemical mechanical polishing (CMP) process.

Figure 7B:
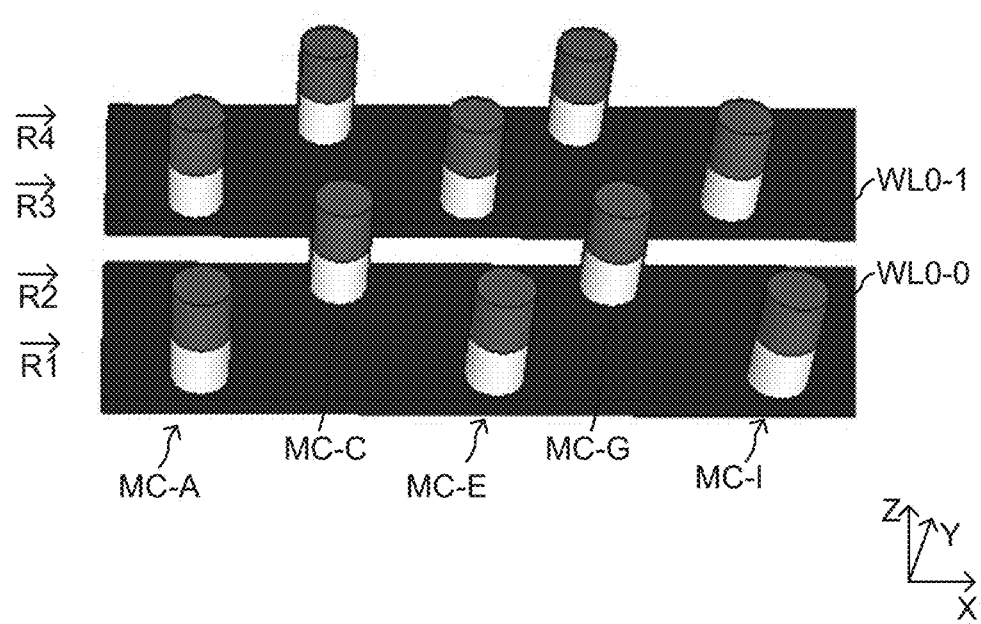
Figure 7C:
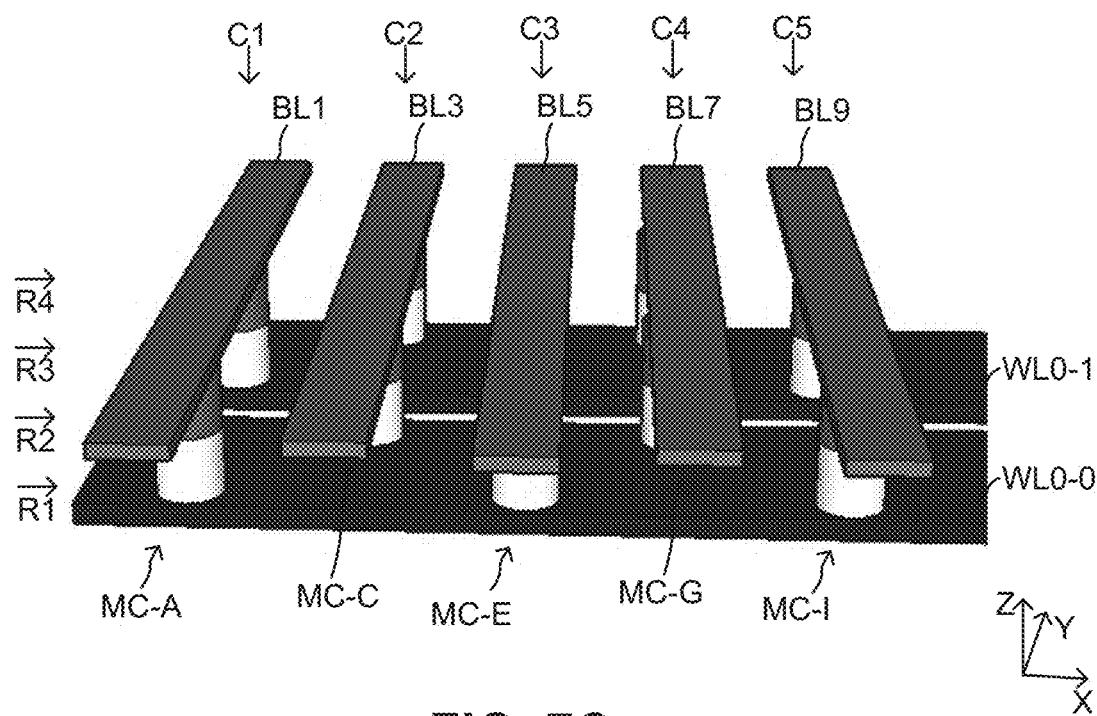

At operation 610, memory cells for the first deck are formed on the word line metal tracks for the first deck. As shown in FIG. 7B, memory cells MC-A, MC-C, MC-E, MC-G, and MC-I, which are located on two rows (i.e., the row R1 and the row R2) are formed on the word line metal track corresponding to the word line WL0-0. Memory cells on two rows share a common word line. In one implementation, the memory cells are formed by depositing the selector layer on the word line metal tracks, depositing the PCM layer on the selector layer, and patterning and etching the selector layer and the PCM layer to form the memory cells.

At operation 612, bit line metal tracks for the first deck and the second deck are formed on the memory cells. Each column of memory cells corresponds to one bit line metal track. As explained above, this is possible because the memory cells in two neighboring rows are displaced in the X-direction. In one implementation, the bit line metal tracks for the first deck and the second deck are formed by forming trenches in the at least one ILD layer and filling metal layer in the trenches, followed by a planarization process such as a CMP process.

Figure 7D:
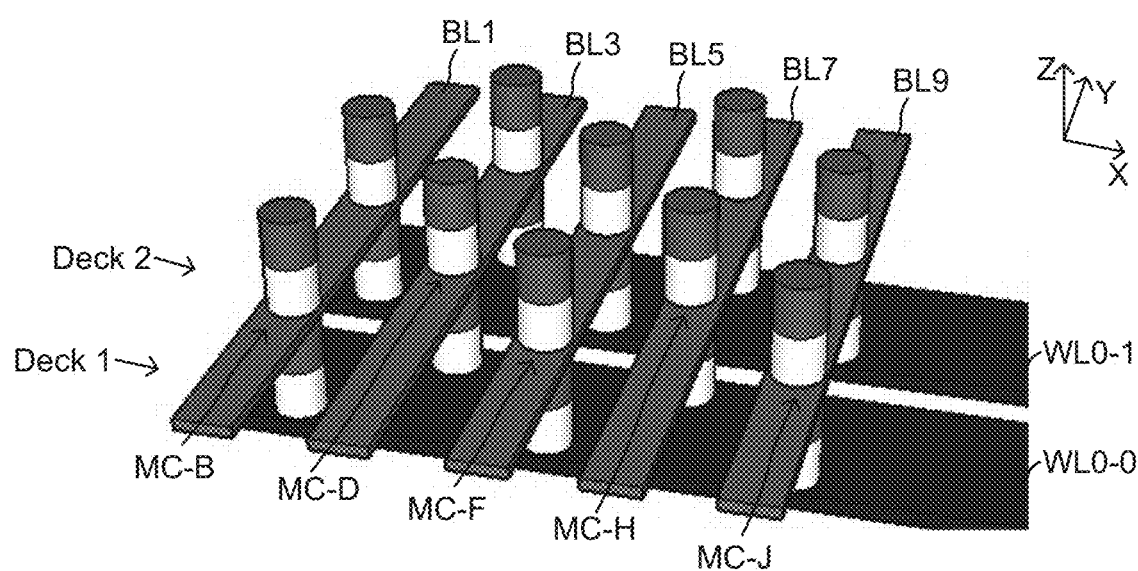

At operation 614, memory cells for the second deck are formed on the bit line metal tracks for the first deck and the second deck. As shown in FIG. 7D, the memory cells MC-B, MC-D, MC-F, MC-H, and MC-J are formed on the bit line metal tracks corresponding to bit lines BL1, BL2, BL3, BL4, and BL5, respectively.

Figure 7E:
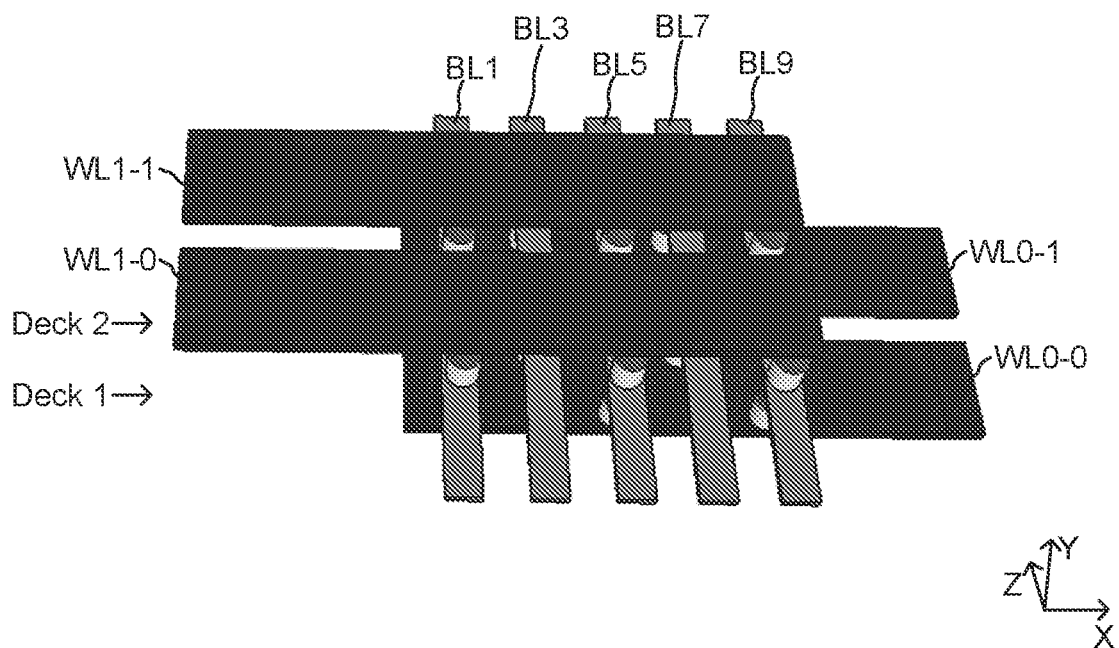

At operation 616, word line metal tracks for the second deck are formed. As shown in FIG. 7E, the word line metal tracks corresponding to the word lines WL1-0 and WL1-1 are formed on the memory cells in the second deck. The implementation of operation 616 is similar to that of operation 608 in one example. As such, the first deck (i.e., Deck 1) and the second (i.e., Deck 2) are completed.

Figure 7F:
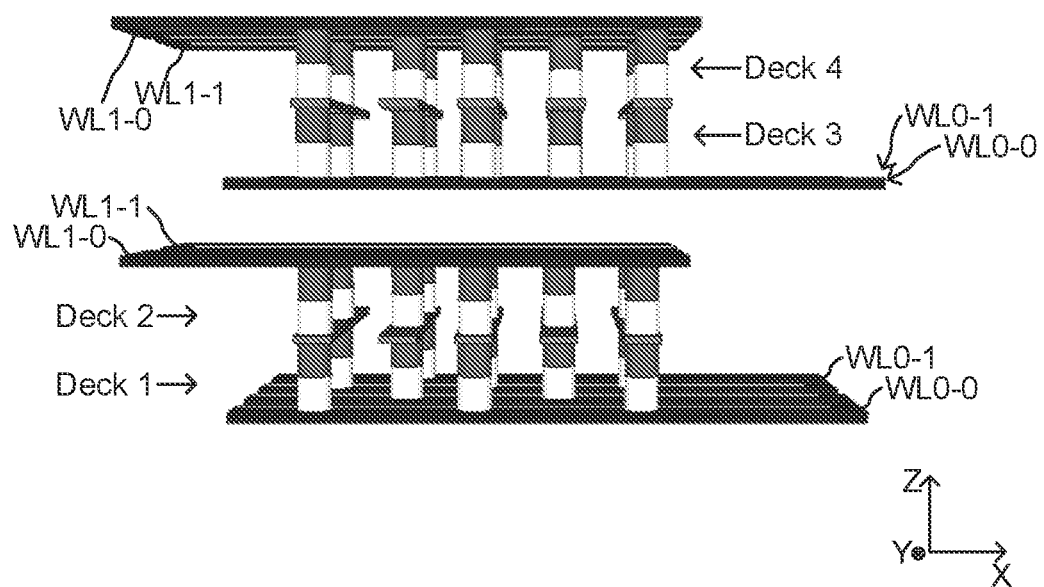

Operations 618, 620, 622, and 624 are similar to operations 608, 610, 612, 612, and 624. Therefore, details of operations 618, 620, 622, and 624 are not described again. After operations 618, 620, 622, and 624, the third deck (i.e., Deck 3) and the fourth deck (i.e., Deck 4) are completed. As shown in FIG. 7F, the third deck and the fourth deck are aligned with the first deck and the second deck in the X-Y plane. The common word lines WL0-0 and WL0-1 are shared between the first deck and the third deck, whereas the common word lines WL1-0 and WL1-1 are shared between the second deck and the fourth deck.

Figure 7G:
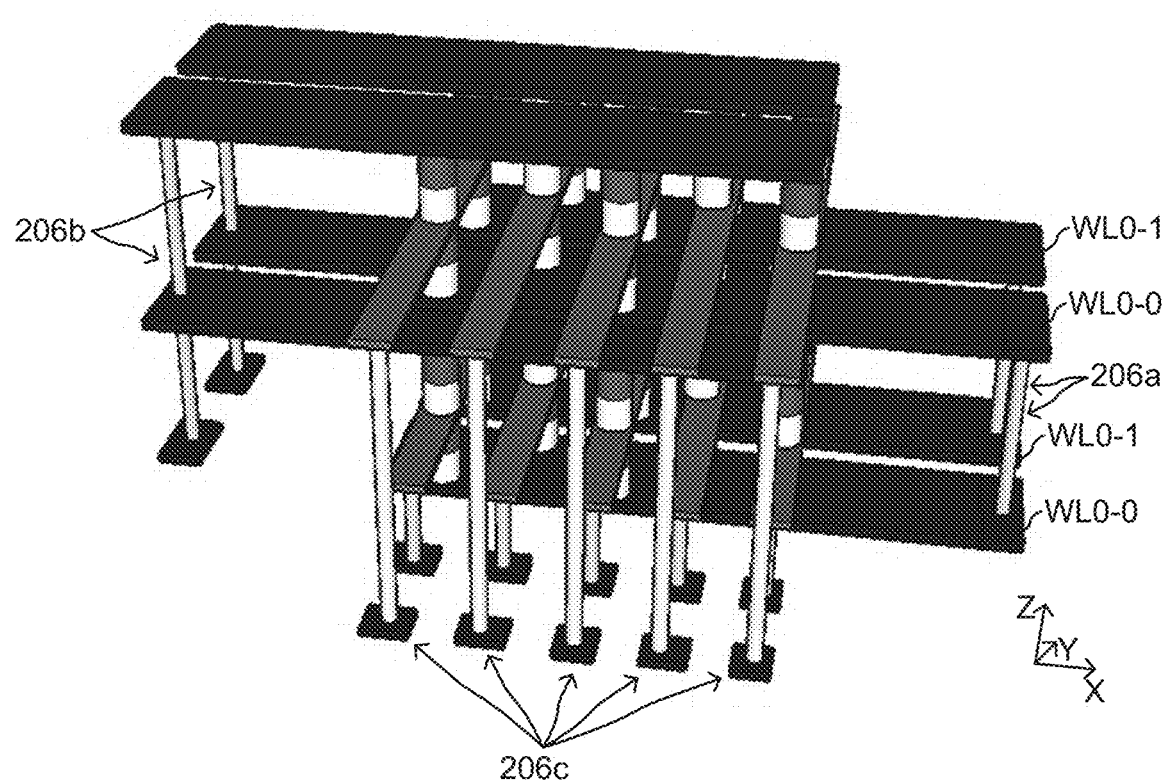

At operation 626, a first group of word line vias are formed to connect the word line metal tracks for the first deck and the word line metal tracks for the third deck. At operation 628, a second group of word line vias are formed to connect the word line metal tracks for the second deck and the word line metal tracks for the fourth deck. As shown in FIG. 7G, the word line metal tracks in the first deck and the word line metal tracks in the third deck are vertically connected through the first group of word line vias 206a; the word line metal tracks in the second deck and the word line metal tracks in the fourth deck are vertically connected through the second group of word line vias 206b.

At operation 630, bit line vias for the bit line metal tracks for the first deck and the second deck and bit line vias for the bit line metal tracks for the third deck and the fourth deck are formed. Each bit line metal track has its own bit line via. As shown in FIG. 7G, bit line vias 206c are formed, and each bit line via 206c corresponds to one bit line metal track.

SUMMARY

In accordance with some aspects of the disclosure, a cell array of a memory device is provided. The cell array includes: a first deck of memory cells arranged in a first row and a second row extending in a first horizontal direction and a plurality of columns extending in a second horizontal direction perpendicular to the first horizontal direction, wherein the memory cells in the second row in the first deck is displaced in the first horizontal direction with respect to the memory cells in the first row in the first deck; a first common word line metal track extending in the first horizontal direction, wherein both the memory cells in the first row in the first deck and the memory cells in the second row in the first deck are disposed on the first common word line metal track; and a plurality of first bit line metal tracks extending in the second horizontal direction, wherein each of the plurality of first bit line metal tracks is disposed on one of the first deck of memory cells.

In accordance with some aspects of the disclosure, a cell array of a memory device is provided. The cell array includes: a first common word line metal track and a third common word line metal track extending in a first horizontal direction and electrically connected together, the third common word line metal track being above the first common word line metal track; a second common word line metal track and a fourth common word line metal track extending in the first horizontal direction and electrically connected together, the fourth common word line metal track being above the second common word line metal track, and the second common word line metal track being below the third common word line metal track; a first deck of memory cells, a second deck of memory cells, a third deck of memory cells, and a fourth deck of memory cells aligned in a vertical direction, wherein the first deck of memory cells are disposed on the first common word line metal track, and the third deck of memory cells are disposed on the third common word line metal track; a plurality of first bit line metal tracks extending in a second horizontal direction perpendicular to the first horizontal direction, wherein each of the plurality of first bit line metal tracks is disposed on one of the first deck of memory cells, each of the second deck of memory cells is disposed on one of the plurality of first bit line metal tracks, and the second common word line metal track is disposed on the second deck of memory cells; and a plurality of second bit line metal tracks extending in the second horizontal direction, wherein each of the plurality of second bit line metal tracks is disposed on one of the third deck of memory cells, each of the fourth deck of memory cells is disposed on one of the plurality of second bit line metal tracks, and the fourth common word line metal track is disposed on the fourth deck of memory cells. Each of the first deck of memory cells, the second deck of memory cells, the third deck of memory cells, and the fourth deck of memory cells are arranged in a first row and a second row extending in the first horizontal direction and a plurality of columns extending in the second horizontal direction, and the memory cells in the second row is displaced in the first horizontal direction with respect to the memory cells in the first row.

In accordance with some aspects of the disclosure, a method for fabricating a cell array of a memory device is provided. The method includes the following steps: providing a substrate; forming a first common word line metal track extending in a first horizontal direction over the substrate; forming a first deck of memory cells on the first common word line metal track, wherein the first deck of memory cells are arranged in a first row and a second row extending in the first horizontal direction and a plurality of columns extending in a second horizontal direction perpendicular to the first horizontal direction, and wherein the memory cells in the second row in the first deck is displaced in the first horizontal direction with respect to the memory cells in the first row in the first deck; forming a plurality of first bit line metal tracks extending in the second horizontal direction, wherein each of the plurality of first bit line metal tracks is formed on one of the first deck of memory cells; forming a second deck of memory cells, wherein each of the second deck of memory cells is aligned with one of the first deck of memory cells in a vertical direction, and wherein each of the second deck of memory cells is formed on one of the plurality of first bit line metal tracks; and forming a second common word line metal track extending in the first horizontal direction, wherein the second common word line metal track is formed on the second deck of memory cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A cell array of a memory device, the cell array comprising:
   a first deck of memory cells arranged in a first row and a second row extending in a first horizontal direction and a plurality of columns extending in a second horizontal direction perpendicular to the first horizontal direction, wherein the memory cells in the second row in the first deck is displaced in the first horizontal direction with respect to the memory cells in the first row in the first deck;
   a first common word line metal track extending in the first horizontal direction, wherein both the memory cells in the first row in the first deck and the memory cells in the second row in the first deck are disposed on the first common word line metal track;
   a plurality of first bit line metal tracks extending in the second horizontal direction, wherein each of the plurality of first bit line metal tracks is disposed on one of the first deck of memory cells;
   a second deck of memory cells, wherein each of the second deck of memory cells is aligned with one of the first deck of memory cells in a vertical direction, and wherein each of the second deck of memory cells is disposed on one of the plurality of first bit line metal tracks;
   a second common word line metal track extending in the first horizontal direction, wherein the second common word line metal track is disposed on both the memory cells in the first row in the second deck and the memory cells in the second row in the second deck;
   a third deck of memory cells arranged in the first row and the second row extending in the first horizontal direction and the plurality of columns extending in the second horizontal direction, wherein each of the third deck of memory cells is aligned with one of the second deck of memory cells in the vertical direction;
   a third common word line metal track extending in the first horizontal direction, wherein both the memory cells in the first row in the third deck and the memory cells in the second row in the third deck are disposed on the third common word line metal track;
   a plurality of second bit line metal tracks extending in the second horizontal direction, wherein each of the plurality of second bit line metal tracks is disposed on one of the third deck of memory cells; and
   a first vertical via extending in a vertical direction and connecting the first common word line metal track and the third common word line metal track.

2. The cell array of claim 1, further comprising:
   a fourth deck of memory cells, wherein each of the fourth deck of memory cells is aligned with one of the third deck of memory cells in the vertical direction, and wherein each of the fourth deck of memory cells is disposed on one of the plurality of second bit line metal tracks; and
   a fourth common word line metal track extending in the first horizontal direction, wherein the fourth common word line metal track is disposed on both the memory cells in the first row in the fourth deck and the memory cells in the second row in the fourth deck.

3. The cell array of claim 2, further comprising:
a second vertical via extending in the vertical direction and connecting the second common word line metal track and the fourth common word line metal track.

4. The cell array of claim 2, wherein each of the first deck of memory cells, the second deck of memory cells, the third deck of memory cells, and the fourth deck of memory cells comprises a storage element and an access element.

5. The cell array of claim 4, wherein the storage element is a phase-change material (PCM) layer.

6. The cell array of claim 4, wherein the access element is a selector.

7. The cell array of claim 1, wherein the memory cells in the second row in the first deck is displaced in the first horizontal direction with respect to the memory cells in the first row in the first row such that none of any two of the memory cells in the first deck overlap in the first horizontal direction.

8. A cell array of a memory device comprising:
a first common word line metal track and a third common word line metal track extending in a first horizontal direction and electrically connected together, the third common word line metal track being above the first common word line metal track;
a second common word line metal track and a fourth common word line metal track extending in the first horizontal direction and electrically connected together, the fourth common word line metal track being above the second common word line metal track, and the second common word line metal track being below the third common word line metal track;
a first deck of memory cells, a second deck of memory cells, a third deck of memory cells, and a fourth deck of memory cells aligned in a vertical direction, wherein the first deck of memory cells are disposed on the first common word line metal track, and the third deck of memory cells are disposed on the third common word line metal track;
a plurality of first bit line metal tracks extending in a second horizontal direction perpendicular to the first horizontal direction, wherein each of the plurality of first bit line metal tracks is disposed on one of the first deck of memory cells, each of the second deck of memory cells is disposed on one of the plurality of first bit line metal tracks, and the second common word line metal track is disposed on the second deck of memory cells; and
a plurality of second bit line metal tracks extending in the second horizontal direction, wherein each of the plurality of second bit line metal tracks is disposed on one of the third deck of memory cells, each of the fourth deck of memory cells is disposed on one of the plurality of second bit line metal tracks, and the fourth common word line metal track is disposed on the fourth deck of memory cells; and
wherein each of the first deck of memory cells, the second deck of memory cells, the third deck of memory cells, and the fourth deck of memory cells are arranged in a first row and a second row extending in the first horizontal direction and a plurality of columns extending in the second horizontal direction, and wherein the memory cells in the second row is displaced in the first horizontal direction with respect to the memory cells in the first row.

9. The cell array of claim 8, wherein the memory cells in the second row is displaced in the first horizontal direction with respect to the memory cells in the first row such that none of any two of the memory cells in the first deck overlap in the first horizontal direction.

10. The cell array of claim 8, wherein the first common word line metal track and the third common word line metal track are electrically connected together through a first vertical via.

11. The cell array of claim 10, wherein the second common word line metal track and the fourth common word line metal track are electrically connected together through a second vertical via.

12. The cell array of claim 8, wherein each of the first common word line metal track, the second common word line metal track, the third common word line metal track, and the fourth common word line metal track includes a slit extending in the first horizontal direction.

13. The cell array of claim 8, wherein each of the first deck of memory cells, the second deck of memory cells, the third deck of memory cells, and the fourth deck of memory cells comprises a storage element and an access element.

14. The cell array of claim 13, wherein the storage element is a phase-change material (PCM) layer, and the access element is a selector.

15. A cell array of a memory device, the cell array comprising:
a first deck of memory cells comprising:
a first row of memory cells in the first deck extending in a first horizontal direction; and
a second row of memory cells in the first deck extending in the first horizontal direction, wherein the second row of memory cells in the first deck is displaced, in the first horizontal direction, with respect to the first row of memory cells in the first deck;
a first common word line metal track extending in the first horizontal direction, wherein both the first row of memory cells in the first deck and the second row of memory cells in the first deck are disposed on the first common word line metal track;
a plurality of first bit line metal tracks extending in a second horizontal direction perpendicular to the first horizontal direction, wherein each of the plurality of first bit line metal tracks is disposed on one of the first deck of memory cells;
a second deck of memory cells, wherein each of the second deck of memory cells is aligned with one of the first deck of memory cells in a vertical direction, and wherein each of the second deck of memory cells is disposed on one of the plurality of first bit line metal tracks;
a second common word line metal track extending in the first horizontal direction, wherein the second common word line metal track is disposed on the second deck of memory cells;
a third deck of memory cells, wherein each of the third deck of memory cells is aligned with one of the second deck of memory cells in the vertical direction;
a third common word line metal track extending in the first horizontal direction, wherein the third deck of memory cells are disposed on the third common word line metal track;
a plurality of second bit line metal tracks extending in the second horizontal direction, wherein each of the plurality of second bit line metal tracks is disposed on one of the third deck of memory cells; and
a first vertical via extending in a vertical direction and connecting the first common word line metal track and the third common word line metal track.

16. The cell array of claim 15, wherein the first deck of memory cells comprises a plurality of rows of memory cells comprising the first row of memory cells in the first deck and the second row of memory cells in the first deck, and the second row is a neighboring row of the first row.

17. The cell array of claim 15, further comprising:
a fourth deck of memory cells, wherein each of the fourth deck of memory cells is aligned with one of the third deck of memory cells in the vertical direction, and wherein each of the fourth deck of memory cells is disposed on one of the plurality of second bit line metal tracks.

18. The cell array of claim 17, further comprising:
a fourth common word line metal track extending in the first horizontal direction, wherein the fourth common word line metal track is disposed on the fourth deck of memory cells.

19. The cell array of claim 18, further comprising:
a second vertical via extending in the vertical direction and connecting the second common word line metal track and the fourth common word line metal track.

20. The cell array of claim 17, wherein each of the first deck of memory cells, the second deck of memory cells, the third deck of memory cells, and the fourth deck of memory cells comprises a storage element and an access element.

\* \* \* \* \*